United States Patent
Wu et al.

(10) Patent No.: US 12,259,421 B2
(45) Date of Patent: Mar. 25, 2025

(54) AIRBORNE ELECTROMAGNETIC SIGNAL OBSERVATION DEVICE AND SYSTEM CARRIED BY UNMANNED AERIAL VEHICLE

(71) Applicants: Xin Wu, Beijing (CN); Guoqiang Xue, Beijing (CN)

(72) Inventors: Xin Wu, Beijing (CN); Guoqiang Xue, Beijing (CN)

(73) Assignee: INSTITUTE OF GEOLOGY AND GEOPHYSICS, CHINESE ACADEMY OF SCIENCES, Beijing (CN)

( * ) Notice: Subject to any disclaimer, the term of this patent is extended or adjusted under 35 U.S.C. 154(b) by 265 days.

(21) Appl. No.: 18/113,075

(22) Filed: Feb. 23, 2023

(65) Prior Publication Data
US 2024/0288481 A1    Aug. 29, 2024

(51) Int. Cl.
*B64U 20/80* (2023.01)
*G01R 31/08* (2020.01)
*H04B 3/46* (2015.01)
*B64U 101/00* (2023.01)

(52) U.S. Cl.
CPC .......... *G01R 31/085* (2013.01); *B64U 20/80* (2023.01); *H04B 3/46* (2013.01); *B64U 2101/00* (2023.01)

(58) Field of Classification Search
CPC .... B64U 20/80; B64U 2101/00; B64U 10/13; H04B 3/46
See application file for complete search history.

(56) References Cited

U.S. PATENT DOCUMENTS

| | | | | |
|---|---|---|---|---|
| 2011/0001480 A1* | 1/2011 | Kuzmin | ................. | G01V 3/165 324/330 |
| 2014/0312905 A1* | 10/2014 | Wheelock | ................ | G01V 3/17 324/330 |
| 2021/0302613 A1* | 9/2021 | Wu | .......................... | G01V 3/40 |

FOREIGN PATENT DOCUMENTS

CN            113917549 A   *  1/2022   ............. B64D 47/00

* cited by examiner

*Primary Examiner* — Justin M Benedik

(57) ABSTRACT

The present application proposes an airborne electromagnetic signal observation device and a system carried by an unmanned aerial vehicle (UAV). The device includes an inner frame, an outer frame and a flexible support that are connected to each other. The device and the system can enhance the stability of the sensor in flight and greatly suppress motion noise.

10 Claims, 2 Drawing Sheets

AIRBORNE ELECTROMAGNETIC SIGNAL OBSERVATION DEVICE AND SYSTEM CARRIED BY UNMANNED AERIAL VEHICLE

TECHNICAL FIELD

The present invention relates to the technical field of geophysical exploration, in particular to an airborne electromagnetic signal observation device and system carried by an unmanned aerial vehicle (UAV).

BACKGROUND ART

The controlled-source electromagnetic method uses a ground wire or a closed loop as a transmitting device to excite the ground, and extracts distribution information of electrical parameters of the ground by observing response signals of the ground. Traditional electromagnetic devices are arranged on the surface, so it is usually difficult to work quickly in deserts, Gobi, mountains, wetlands, and areas with dense water networks. In order to overcome the limitations of geographic and geomorphic conditions, two types of airborne electromagnetic observation methods have successively emerged since the 1970s: an airborne electromagnetic method (AEM) and a semi-airborne electromagnetic method (SAEM).

In the AEM, all detection devices are carried on a flight platform, which achieves high work efficiency. However, parameters such as transmitting power and antenna size are limited by the power supply and carrying capabilities of the flight platform, resulting in a relatively limited detection depth. Different from the AEM, a transmitting end (transmitter+antenna) of the system is usually arranged on the surface and a receiving end (receiver+sensor) is carried on the flight platform in the SAEM. Because the parameters such as the weight and power of the transmitting end can be unlimited in principle, the SAEM can achieve a larger detection depth than the AEM; meanwhile, because the observation device is carried on the flight platform, motion observation of ground response can be achieved, so that higher work efficiency can also be achieved.

According to different application requirements, the receiving end in the SAEM is usually designed in the following two solutions:
1) Multi-field and multi-component complex sensor. This sensor can acquire more detection information in one flight. However, this type of design usually results in a large overall weight of a sensor pod, and the sensor pod must be carried by a helicopter or heavy-duty UAV, so the detection cost is relatively high.
2) Single-field and single-component sensor. Although this sensor is usually only used to observe Z-axis magnetic field response, the system structure is relatively simple, the overall weight is light, and the system can be carried by a light civilian UAV, so the holding, operation and maintenance costs are very low.

In contrast, the second solution is more attractive to small- and medium-sized users and economically underdeveloped areas.

At present, the mainstream carrying form of single field and single component is shown in FIG. 1. An SAEM receiver is mounted on the bottom of a UAV: one end of a main cable is connected to the bottom of the UAV, and the other end is connected to an umbrella-like cable structure for mounting an SAEM sensor; and the SAEM receiver is connected to the sensor by a data cable to record and store observation data. This carrying form is simple in structure and easy to implement, and has been widely used.

In the application, it is found that there are certain problems in the above-mentioned carrying form, mainly as follows:
1) The single main cable causes the sensor to oscillate back and forth in the vertical direction on the horizontal plane during flight. This phenomenon is especially obvious when the UAV is turning (when entering a new survey line) and crosswind occurs. In actual observations, it is found that the amplitude of such oscillation is often large and the oscillation lasts for a long time, which will cause the projection area of the sensor (coil) on the horizontal plane to change drastically for a long time, thus having a serious impact on the observation data.
2) The receiver is installed under the UAV, and the electromagnetic noise and mechanical vibration of the UAV itself will cause significant interference to the received data. Meanwhile, the long data cable used to connect the receiver with the sensor will also increase the probability of external noise intrusion, and also increase the weight of the system, which will ultimately affect data quality.

The current design method chooses the long main cable (usually more than 10 meters) based on the following consideration: placing the sensor far away from the UAV, thereby reducing the impact of electromagnetic noise of the UAV on the data. However, practice has proved: the motion noise caused by the swing of the sensor is much stronger and more complex than the electromagnetic noise of the UAV: the installation of the receiver under the UAV for simply shortening the distance between the UAV and the sensor cannot completely solve problems, and the interference of the UAV can still enter the data through the receiver.

SUMMARY OF THE INVENTION

The present invention provides an airborne electromagnetic signal observation device and system carried by a UAV, which can significantly enhance the stability of a sensor in flight and greatly suppress motion noise.

In order to achieve the above invention purposes, the technical solution adopted by the present invention is as follows:

In a first aspect, the present invention provides an airborne electromagnetic signal observation device carried by a UAV, including:
an inner frame, an outer frame and a flexible support that are connected to each other, wherein the surface of the outer frame is provided with a plurality of mount points for connecting cables; the flexible support is installed under the UAV, the flexible support is of a multi-spoke umbrella-like structure, and the top of each spoke is connected to a mount point of the outer frame by a cable;
the outer frame is of a hollow closed structure, and the inside of a tube of the outer frame is used to install each electronic unit of a receiver; the surface of the outer frame is provided with one or more cable interfaces, and the cable interfaces are used to connect sensor output signal cables; and the inner frame is used to accommodate an inductive magnetic sensor.

Preferably, the inner frame and the outer frame are horizontally coplanar and concentric.

Preferably, the overall shape of the outer frame includes a circle or a square, and the cross-sectional shape of the outer frame tube includes a circle or a square.

Preferably, the device of claim 1, wherein the inner frame and the outer frame are connected by a shock absorbing material.

Preferably, the number of cable interfaces on the surface of the outer frame is set according to the number of sensors accommodated in the inner frame.

Preferably, the inner frame accommodates a single Z-axis inductive magnetic sensor, or a dual-axis inductive magnetic sensor, or a three-axis inductive magnetic sensor.

Preferably, the number of spokes in the flexible support is the same as the number of mount points on the outer frame, one end of each cable is connected to the top of the spoke, and the other end is connected to the mount point on the outer frame.

Preferably, when the inner frame is used to accommodate the single inductive magnetic sensor, the overall shape of the inner frame includes a circle or a square, the cross-sectional shape of the inner frame tube includes a circle or a square, the inside of the inner frame tube is used to install each electronic unit of the inductive magnetic sensor, and the surface of the inner frame is provided with a cable interface for connecting a sensor output signal cable;

when the inner frame is used to accommodate the dual-axis inductive magnetic sensor, the inner frame is composed of two orthogonal tubular frames, one of which is used to observe electromagnetic signals in the advancing direction of the UAV, and the other is used to observe electromagnetic signals in the vertical direction: the respective overall shapes of the two orthogonal tubular frames of the inner frame include circles or squares; the cross-sectional shapes of tubes of the two orthogonal tubular frames of the inner frame include circles or squares, the insides of the two orthogonal tubular frames of the inner frame are used to install each electronic unit of the inductive magnetic sensor, and the surfaces of the two orthogonal tubular frames are each provided with a cable interface for connecting a sensor output signal cable;

when the inner frame is used to accommodate the three-axis inductive magnetic sensor, the inner frame is composed of three orthogonal tubular frames, which are respectively used to observe electromagnetic signals in the advancing direction of the UAV, electromagnetic signals in the vertical direction, and electromagnetic signals in the horizontal direction perpendicular to the advancing direction of the UAV; the respective overall shapes of the three orthogonal tubular frames of the inner frame include circles or squares, the insides of the three orthogonal tubular frames of the inner frame are used to install each electronic unit of the inductive magnetic sensor, and the surfaces of the three orthogonal tubular frames are each provided with a cable interface for connecting a sensor output signal cable.

In a second aspect, the present invention further provides an airborne electromagnetic signal observation system carried by a UAV, including: a UAV, and an inner frame, an outer frame and a flexible support that are connected to each other, wherein the surface of the outer frame is provided with a plurality of mount points for connecting cables: the flexible support is installed under the UAV, the flexible support is of a multi-spoke umbrella-like structure, and the top of each spoke is connected to a mount point of the outer frame by a cable;

the outer frame is of a hollow closed structure, and the inside of a tube of the outer frame is used to install each electronic unit of a receiver; the surface of the outer frame is provided with one or more cable interfaces, and the cable interfaces are used to connect sensor output signal cables; and the inner frame is used to accommodate an inductive magnetic sensor.

Preferably, the inner frame and the outer frame are connected by a shock absorbing material.

Compared with the prior art, the present invention has the following beneficial effects:

The present invention proposes an airborne electromagnetic signal observation device and system carried by a UAV, where the integrated receiver-sensor and the umbrella-like flexible support fully avoid electromagnetic noise of the UAV, significantly enhance the stability of the sensor in flight, and greatly suppress motion noise. Therefore, the present invention is of great significance to improve the quality of semi-airborne observation data.

DETAILED DESCRIPTION OF THE EMBODIMENTS

In order to make the purposes, technical solutions and beneficial effects of the present invention clearer, the embodiments of the present invention will be described below with reference to the accompanying drawings. It should be noted that the embodiments in the present application and the features in the embodiments may be combined with each other on a non-conflict basis.

Figure 1:
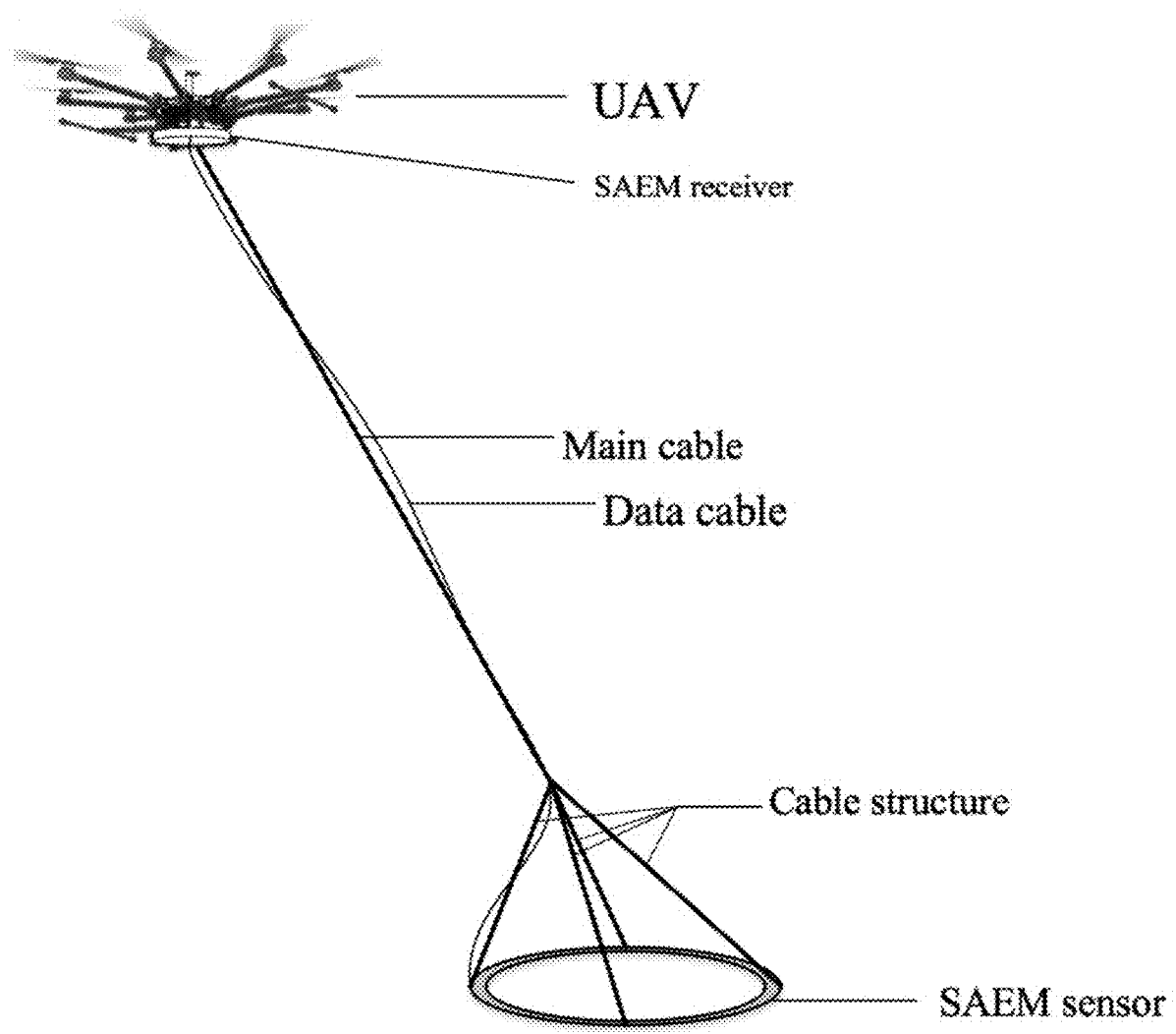
FIG. 1 is a schematic diagram of an airborne electromagnetic signal observation device carried by a UAV in related technologies.
Figure 2:
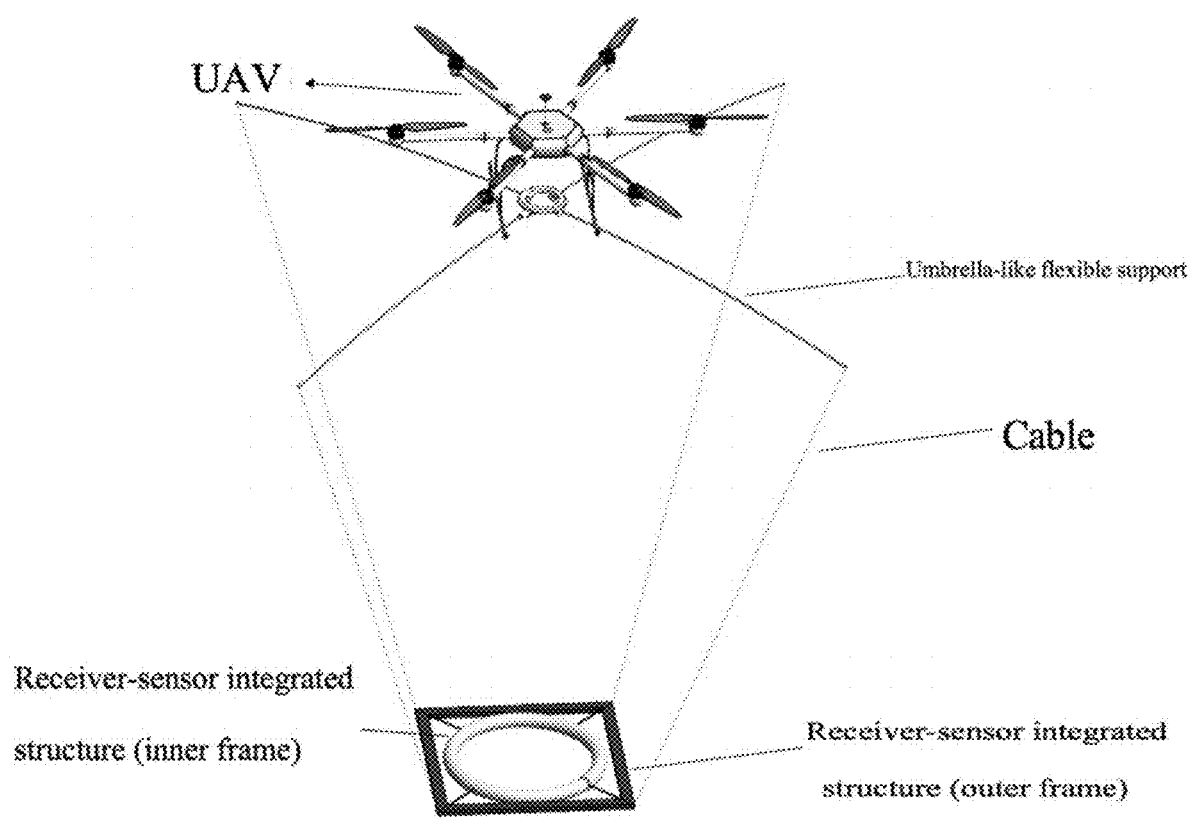
FIG. 2 is a schematic structural diagram of an airborne electromagnetic signal observation device carried by a UAV according to an embodiment of the present invention.

As shown in FIG. 2, an embodiment of the present invention provides an airborne electromagnetic signal observation device carried by a UAV, including:

an inner frame, an outer frame and a flexible support that are connected to each other. The surface of the outer frame is provided with a plurality of mount points for connecting cables; the flexible support is installed under the UAV, the flexible support is of a multi-spoke umbrella-like structure, and the top of each spoke is connected to a mount point of the outer frame by a cable.

The outer frame is of a hollow closed structure, and the inside of a tube of the outer frame is used to install each electronic unit of a receiver; the surface of the outer frame is provided with one or more cable interfaces, and the cable interfaces are used to connect sensor output signal cables; and the inner frame is used to accommodate an inductive magnetic sensor.

In the embodiment of the present invention, the overall shape of the outer frame includes but is not limited to a circle or a square, and the cross-sectional shape of the outer frame tube includes but is not limited to a circle or a square. The inside of the outer frame tube is used to install each electronic unit of the receiver. The surface of the outer frame is provided with cable interfaces, the number of which depends on the number of sensors accommodated in the inner frame, and the cable interfaces are used to connect sensor output signal cables. The surface of the outer frame is provided with a plurality of mount points for connecting cables. The inner frame is functionally to accommodate an inductive magnetic sensor (air core coil).

In the embodiment of the present invention, the flexible support is of a multi-spoke umbrella-like structure composed of a plurality of semi-rigid tubular or columnar materials, and the number of spokes is the same as the number of mount points designed on the outer frame. The whole flexible support is installed on the UAV. One end of the cable is connected to the top of each spoke, and the other end is connected to the mount point designed on the outer frame of the receiver-sensor integrated structure.

In the embodiment of the present invention, the inner frame and the outer frame are horizontally coplanar and concentric.

In the embodiment of the present invention, the overall shape of the outer frame includes a circle or a square, and the cross-sectional shape of the outer frame tube includes a circle or a square.

In the embodiment of the present invention, the inner frame and the outer frame are connected by a shock absorbing material.

In the embodiment of the present invention, an inner frame and an outer frame are included, and the two frames are connected by shock absorbing material.

In the embodiment of the present invention, the number of cable interfaces on the surface of the outer frame is set according to the number of sensors accommodated in the inner frame.

In the embodiment of the present invention, the inner frame accommodates a single inductive magnetic sensor, or a dual-axis inductive magnetic sensor, or a three-axis inductive magnetic sensor.

In the embodiment of the present invention, the number of spokes in the flexible support is the same as the number of mount points on the outer frame, one end of each cable is connected to the top of the spoke, and the other end is connected to the mount point on the outer frame.

In the embodiment of the present invention, when the inner frame is used to accommodate the single inductive magnetic sensor, the overall shape of the inner frame includes a circle or a square, the cross-sectional shape of the inner frame tube includes a circle or a square, the inside of the inner frame tube is used to install each electronic unit of the inductive magnetic sensor, and the surface of the inner frame is provided with a cable interface for connecting a sensor output signal cable.

When the inner frame is used to accommodate the dual-axis inductive magnetic sensor, the inner frame is composed of two orthogonal tubular frames, one of which is used to observe electromagnetic signals in the advancing direction of the UAV, and the other is used to observe electromagnetic signals in the vertical direction: the respective overall shapes of the two orthogonal tubular frames of the inner frame include circles or squares: the cross-sectional shapes of tubes of the two orthogonal tubular frames of the inner frame include circles or squares, the insides of the two orthogonal tubular frames of the inner frame are used to install each electronic unit of the inductive magnetic sensor, and the surfaces of the two orthogonal tubular frames are each provided with a cable interface for connecting a sensor output signal cable.

When the inner frame is used to accommodate the three-axis inductive magnetic sensor, the inner frame is composed of three orthogonal tubular frames, which are respectively used to observe electromagnetic signals in the advancing direction of the UAV, electromagnetic signals in the vertical direction, and electromagnetic signals in the horizontal direction perpendicular to the advancing direction of the UAV: the respective overall shapes of the three orthogonal tubular frames of the inner frame include circles or squares, the insides of the three orthogonal tubular frames of the inner frame are used to install each electronic unit of the inductive magnetic sensor, and the surfaces of the three orthogonal tubular frames are each provided with a cable interface for connecting a sensor output signal cable.

An embodiment of the present invention further provides an airborne electromagnetic signal observation system carried by a UAV, including: a UAV, and an inner frame, an outer frame and a flexible support that are connected to each other. The surface of the outer frame is provided with a plurality of mount points for connecting cables: the flexible support is installed under the UAV, the flexible support is of a multi-spoke umbrella-like structure, and the top of each spoke is connected to a mount point of the outer frame by a cable.

The outer frame is of a hollow closed structure, and the inside of a tube of the outer frame is used to install each electronic unit of a receiver; the surface of the outer frame is provided with one or more cable interfaces, and the cable interfaces are used to connect sensor output signal cables; and the inner frame is used to accommodate an inductive magnetic sensor.

In the embodiment of the present invention, the inner frame and the outer frame are connected by a shock absorbing material.

Example

In this example, an agricultural plant protection UAV is used to carry the electromagnetic signal observation device proposed in the present invention.

As shown in FIG. 2, the flexible support is of a multi-spoke umbrella-like structure composed of 4 carbon fiber tubes, and is integrally installed on an undercarriage of the UAV. The selected carbon fiber tubes as a semi-rigid material can provide sufficient support on the one hand, and can suppress the vibration of the UAV on the other hand. A cable is connected to the top of each carbon fiber tube, and the other end of the cable is connected to a mount point on the outer frame of the receiver-sensor integrated structure. Because the cables are of a flexible material, the vibration of the UAV will be further removed, and can thus be prevented from propagating to the receiver-sensor integrated structure. In addition, it should be noted that the diameter of the circumscribed circle of the flexible support should be much larger than the diameter of the circumscribed circle of the inner frame of the receiver-sensor integrated structure, so that the horizontal swing of the receiver-sensor integrated structure during flight can be effectively avoided.

As shown in FIG. 2, the receiver-sensor integrated structure is composed of an inner frame and an outer frame, which are connected by an engineering rubber material. The overall shape of the outer frame is square, and the cross-sectional shape of its tube is also square. In the outer frame, various electronic units of the receiver are distributed, including: a circuit board, a battery, a memory card reader, an indicator light, etc. The memory card reader, the battery, etc. have openings on the surface of the outer frame, so as to facilitate the loading and unloading of the battery and a memory card.

As shown in FIG. 2, the inner frame of the receiver-sensor integrated structure is of a single Z-axis mode, and the inner and outer frames are horizontally coplanar and concentric.

The overall shape of the inner frame is circular, and the cross-sectional shape of the inner frame tube is also circular. The inside of the inner frame tube is used to install each electronic unit of the inductive magnetic sensor. The surface of the inner frame is provided with a cable interface for connecting a sensor output signal cable.

The invention claimed is:

1. An airborne electromagnetic signal observation device carried by an unmanned aerial vehicle (UAV), comprising:
   an inner frame, an outer frame and a flexible support that are connected to each other, wherein the surface of the outer frame is provided with a plurality of mount points for connecting cables; the flexible support is installed under the UAV, the flexible support is of a multi-spoke umbrella-like structure, and the top of each spoke is connected to a mount point of the outer frame by a cable;
   the outer frame is of a hollow closed structure, and the inside of a tube of the outer frame is used to install each electronic unit of a receiver; the surface of the outer frame is provided with one or more cable interfaces, and the cable interfaces are used to connect sensor output signal cables; and the inner frame is used to accommodate an inductive magnetic sensor.

2. The device of claim 1, wherein the inner frame and the outer frame are horizontally coplanar and concentric.

3. The device of claim 1, wherein the overall shape of the outer frame includes a circle or a square, and the cross-sectional shape of the outer frame tube includes a circle or a square.

4. The device of claim 1, wherein the inner frame and the outer frame are connected by a shock absorbing material.

5. The device of claim 1, wherein the number of cable interfaces on the surface of the outer frame is set according to the number of sensors accommodated in the inner frame.

6. The device of claim 1, wherein the inner frame accommodates a single Z-axis inductive magnetic sensor, or a dual-axis inductive magnetic sensor, or a three-axis inductive magnetic sensor.

7. The device of claim 1, wherein the number of spokes in the flexible support is the same as the number of mount points on the outer frame, one end of each cable is connected to the top of the spoke, and the other end is connected to the mount point on the outer frame.

8. The device of claim 6, wherein when the inner frame is used to accommodate the single inductive magnetic sensor, the overall shape of the inner frame includes a circle or a square, the cross-sectional shape of the inner frame tube includes a circle or a square, the inside of the inner frame tube is used to install each electronic unit of the inductive magnetic sensor, and the surface of the inner frame is provided with a cable interface for connecting a sensor output signal cable;

when the inner frame is used to accommodate the dual-axis inductive magnetic sensor, the inner frame is composed of two orthogonal tubular frames, one of which is used to observe electromagnetic signals in the advancing direction of the UAV, and the other is used to observe electromagnetic signals in the vertical direction: the respective overall shapes of the two orthogonal tubular frames of the inner frame include circles or squares; the cross-sectional shapes of tubes of the two orthogonal tubular frames of the inner frame include circles or squares, the insides of the two orthogonal tubular frames of the inner frame are used to install each electronic unit of the inductive magnetic sensor, and the surfaces of the two orthogonal tubular frames are each provided with a cable interface for connecting a sensor output signal cable;

when the inner frame is used to accommodate the three-axis inductive magnetic sensor, the inner frame is composed of three orthogonal tubular frames, which are respectively used to observe electromagnetic signals in the advancing direction of the UAV, electromagnetic signals in the vertical direction, and electromagnetic signals in the horizontal direction perpendicular to the advancing direction of the UAV; the respective overall shapes of the three orthogonal tubular frames of the inner frame include circles or squares, the insides of the three orthogonal tubular frames of the inner frame are used to install each electronic unit of the inductive magnetic sensor, and the surfaces of the three orthogonal tubular frames are each provided with a cable interface for connecting a sensor output signal cable.

9. An airborne electromagnetic signal observation system carried by a UAV, comprising: a UAV, and an inner frame, an outer frame and a flexible support that are connected to each other, wherein the surface of the outer frame is provided with a plurality of mount points for connecting cables; the flexible support is installed under the UAV, the flexible support is of a multi-spoke umbrella-like structure, and the top of each spoke is connected to a mount point of the outer frame by a cable;
   the outer frame is of a hollow closed structure, and the inside of a tube of the outer frame is used to install each electronic unit of a receiver; the surface of the outer frame is provided with one or more cable interfaces, and the cable interfaces are used to connect sensor output signal cables; and the inner frame is used to accommodate an inductive magnetic sensor.

10. The system of claim 9, wherein the inner frame and the outer frame are connected by a shock absorbing material.

* * * * *